United States Patent
Chen et al.

(10) Patent No.: US 9,449,927 B2
(45) Date of Patent: Sep. 20, 2016

(54) SEAL RING STRUCTURE WITH METAL-INSULATOR-METAL CAPACITOR

(71) Applicant: Taiwan Semiconductor Manufacturing Company, Ltd., Hsin-Chu (TW)

(72) Inventors: Hsien-Wei Chen, Hsin-Chu (TW); Tung-Liang Shao, Hsin-Chu (TW); Ching-Jung Yang, Pingzhen (TW); Yu-Chia Lai, Zhunan Township (TW); Hao-Yi Tsai, Hsin-Chu (TW); Tsung-Yuan Yu, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 158 days.

(21) Appl. No.: 13/744,158

(22) Filed: Jan. 17, 2013

(65) Prior Publication Data
US 2014/0145307 A1 May 29, 2014

Related U.S. Application Data

(60) Provisional application No. 61/731,084, filed on Nov. 29, 2012.

(51) Int. Cl.
| H01L 23/13 | (2006.01) |
| H01L 23/00 | (2006.01) |
| H01L 27/01 | (2006.01) |
| H01L 49/02 | (2006.01) |
| H01L 23/522 | (2006.01) |
| H01L 23/58 | (2006.01) |

(52) U.S. Cl.
CPC ......... *H01L 23/562* (2013.01); *H01L 23/5223* (2013.01); *H01L 23/585* (2013.01); *H01L 27/016* (2013.01); *H01L 28/40* (2013.01); *H01L 2924/0002* (2013.01)

(58) Field of Classification Search
None
See application file for complete search history.

(56) References Cited

U.S. PATENT DOCUMENTS

| 5,608,261 A * | 3/1997 | Bhattacharyya ........ H01L 23/13 257/700 |
| 6,916,722 B2 * | 7/2005 | Huang et al. ................. 438/396 |
| 2007/0241422 A1* | 10/2007 | Chen .................. H01L 23/5223 257/528 |
| 2008/0185685 A1* | 8/2008 | Nakashiba .................... 257/535 |
| 2009/0001515 A1* | 1/2009 | Yamagata .................... 257/532 |
| 2011/0193194 A1* | 8/2011 | Takahashi .............. H01G 4/008 257/532 |

* cited by examiner

*Primary Examiner* — Whitney T Moore
*Assistant Examiner* — Scott R Wilson
(74) *Attorney, Agent, or Firm* — Slater Matsil, LLP

(57) ABSTRACT

A seal ring structure of an integrated circuit includes a seal ring and a metal-insulator-metal (MIM) capacitor. The MIM capacitor includes a top electrode, a bottom electrode disposed below the top electrode, and a first insulating layer disposed between the top electrode and the bottom electrode. The MIM capacitor is disposed within the seal ring and the MIM capacitor is insulated from the seal ring.

20 Claims, 3 Drawing Sheets

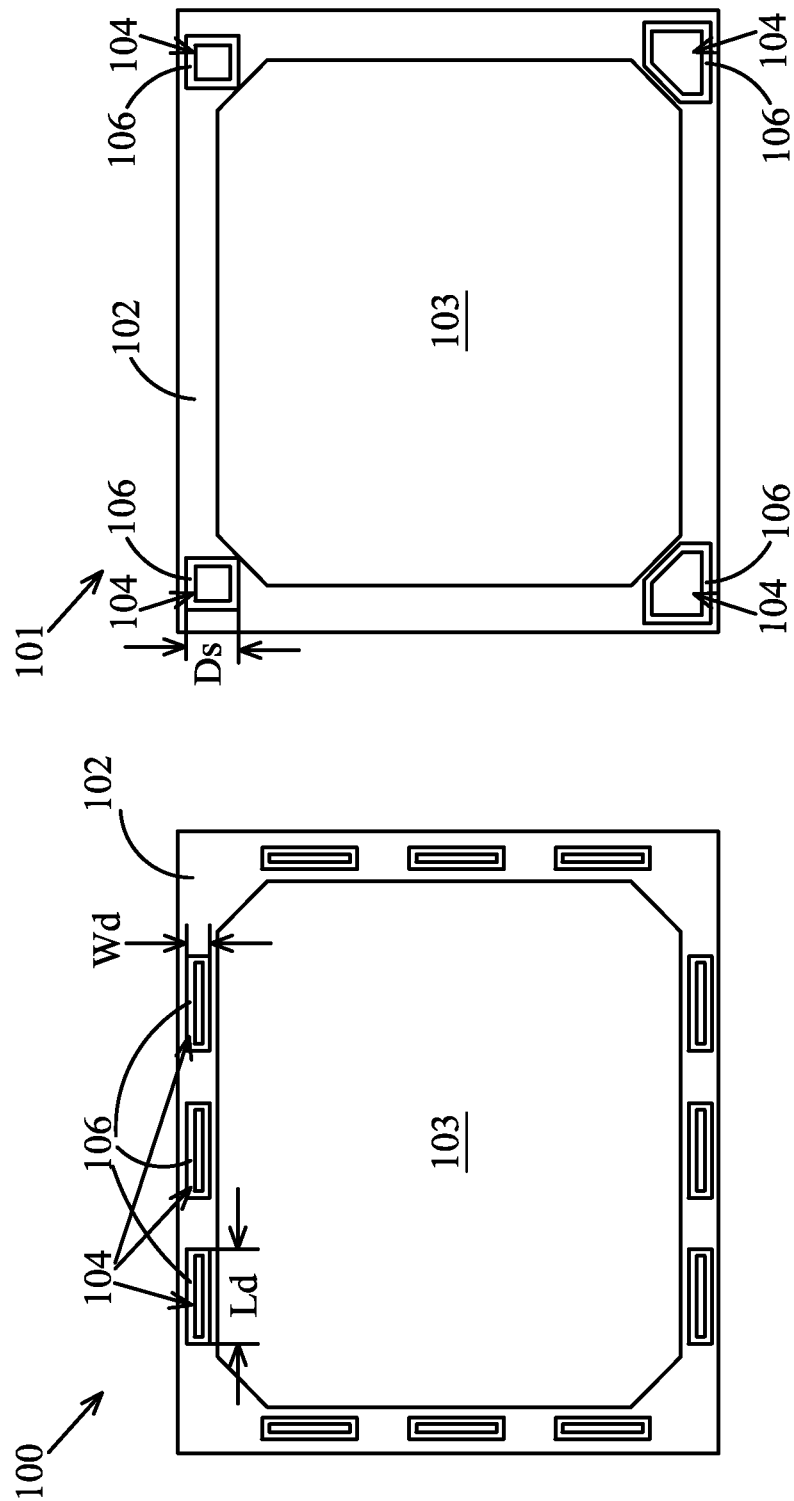

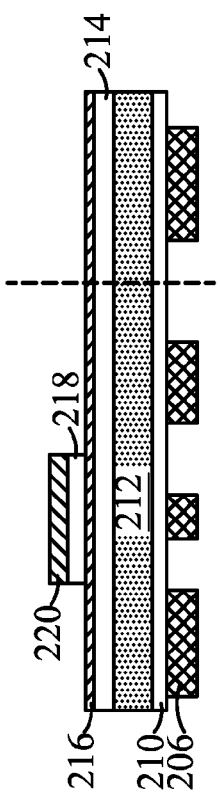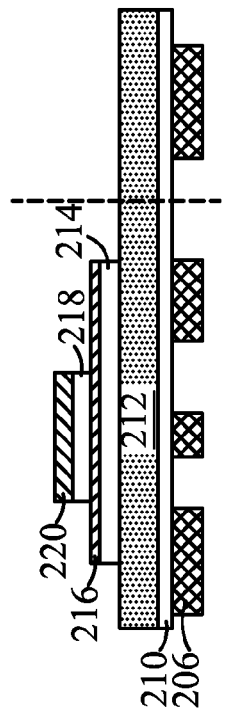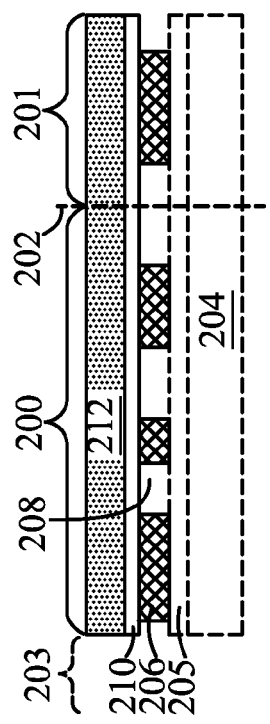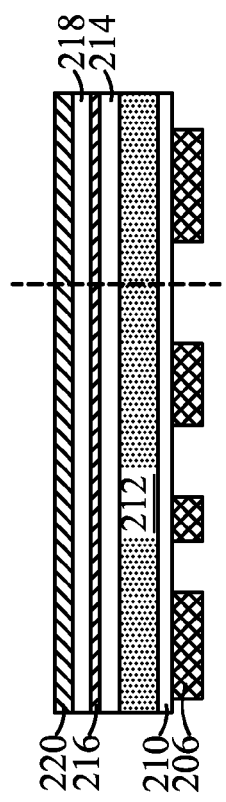

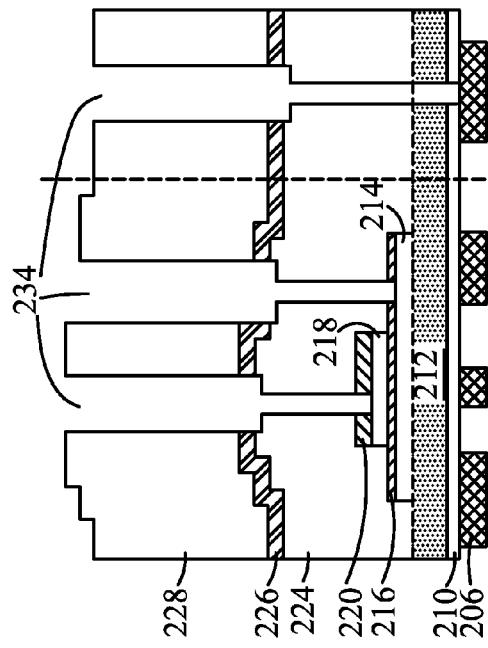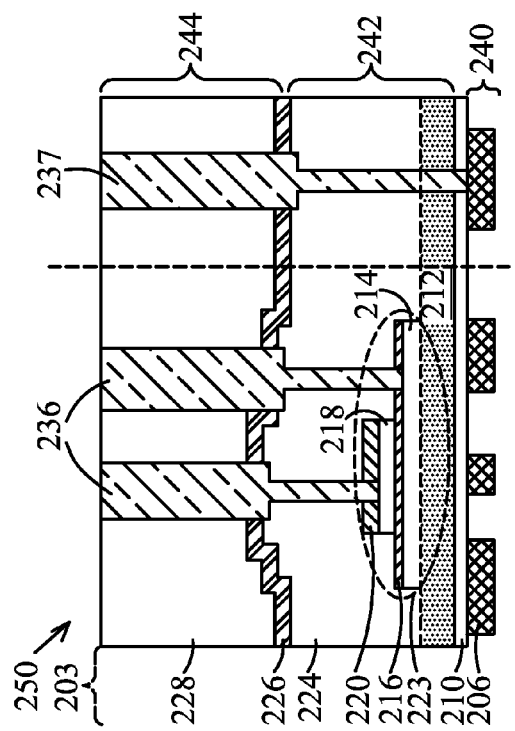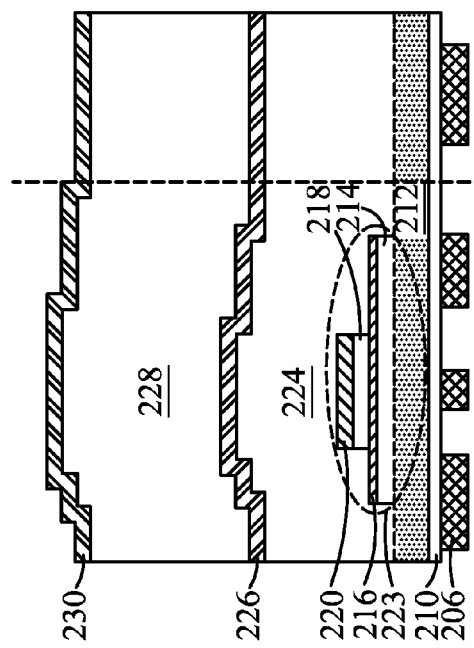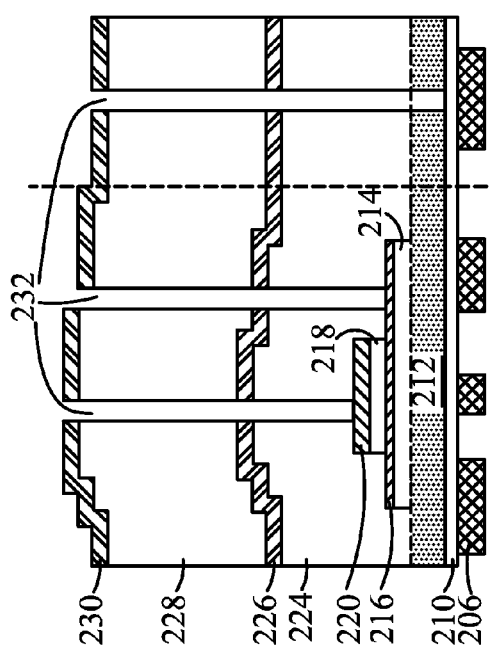

SEAL RING STRUCTURE WITH METAL-INSULATOR-METAL CAPACITOR

RELATED CASE

This application claims priority to U.S. Provisional Patent Application No. 61/731,084, filed Nov. 29, 2012, entitled "Seal Ring Structure with Metal-Insulator-Metal Capacitor," which application is incorporated herein by reference.

TECHNICAL FIELD

The present disclosure relates generally to an integrated circuit and more particularly a metal-insulator-metal (MIM) capacitor.

BACKGROUND

Some integrated circuits have capacitors. The capacitors may use substantial circuit area. Also, high frequency noise interference from surrounding circuits and package reliability can be challenging issues.

BRIEF DESCRIPTION OF THE DRAWINGS

Reference is now made to the following descriptions taken in conjunction with the accompanying drawings, in which:

FIGS. 1A and 1B are schematic diagrams of an exemplary seal ring structure having capacitors formed within the seal ring according to some embodiments; and FIGS. 2A-2H are intermediate steps of fabricating the exemplary seal ring structure having capacitors formed within the seal ring in FIGS. 1A and 1B according to some embodiments.

DETAILED DESCRIPTION

The making and using of various embodiments are discussed in detail below. It should be appreciated, however, that the present disclosure provides many applicable inventive concepts that can be embodied in a wide variety of specific contexts. The specific embodiments discussed are merely illustrative of specific ways to make and use, and do not limit the scope of the disclosure.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

FIGS. 1A and 1B are schematic diagrams of an exemplary seal ring structure having capacitors formed within the seal ring according to some embodiments. In FIG. 1A, an integrated circuit 100 includes a seal ring 102. The seal ring 102 protects integrated circuits 100 during dicing (die sawing) process by preventing cracks and provide a barrier to moisture. Metal-insulator-metal (MIM) capacitors 104 are formed within the seal ring 102 and insulated from the seal ring 102 by insulating layers 106, e.g., dielectric material such as silicon dioxide ($SiO_2$) or PEOX, that surround the MIM capacitor 104. The seal ring 102 comprises electrically conductive material and surrounds a circuit area 103 along four sides of the integrated circuit 100 in a rectangular shape in some embodiments. The seal ring 102 comprises copper, copper alloy, aluminum, aluminum alloy, any combination thereof, or any other suitable material. The MIM capacitors 104 are disposed along the four sides in FIG. 1A.

The insulating layer 106 and MIM capacitor 104 has a total width Wd of about 1 µm to 10 µm and has about 1 µm or more distance from the edge of the seal ring 102 in some embodiments, depending on the available width of the seal ring 102. The insulating layer 106 and the MIM capacitor 104 have a total length Ld of about 1 µm to 100 µm with a spacing distance of about 2.6 µm in between them in some embodiments.

The MIM capacitor 104 can be formed in any layer within the seal ring 102 such as a via layer and the MIM capacitor 104 is insulated from the seal ring 102. The electrical connection for signal input/output of the MIM capacitor 104 can be implemented using vias to a redistribution layer (e.g., aluminum). In some embodiments, at least one metal layer under the MIM capacitor 104 is removed for further insulation from noise interference.

In FIG. 1B, the integrated circuit 101 has similar structure as the integrated circuit 100 in FIG. 1A except that the MIM capacitors 104 are disposed at four corners of the rectangular shape. The insulating layer 106 and MIM capacitor 104 has a total width and length Ds of about 10 µm to 50 µm and has about 1 µm or more distance from the edge of the seal ring 102 in some embodiments, depending on the available width of the seal ring 102.

FIGS. 2A-2H are intermediate steps of fabricating the exemplary seal ring structure having capacitors formed within the seal ring in FIGS. 1A and 1B according to some embodiments. In FIG. 2A, a capacitor area 200 is shown with seal ring area 201 divided by a dotted line 202. Another seal ring area 203 on the left side that is similar to the seal ring area 201 is not shown for simplicity. The MIM capacitor area 200 is within the seal ring to be formed in seal ring areas 201 and 203. A substrate 204 comprises silicon, silicon dioxide, aluminum oxide, sapphire, germanium, gallium arsenide (GaAs), an alloy of silicon and germanium, indium phosphide (InP), silicon on insulator, or any other suitable material. A dielectric layer 205 such as silicon dioxide ($SiO_2$) is disposed over the substrate 204. The substrate 204 and the dielectric layer 205 are not shown in the subsequent figures for simplicity.

A metal layer 206 ($M_X$) may have dielectric layer 208 in between metal patterns. The metal layer 206 comprises copper, copper alloy, aluminum, aluminum alloy, any combination thereof, or any other suitable material. An etch stop layer 210 such as silicon carbide (SiC) or silicon nitride (SiN) is deposited over the metal layer 206. The etch stop layer 210 has a thickness of about 500 angstrom in some embodiments. A dielectric layer 212 such as silicon dioxide ($SiO_2$) or PEOX is disposed over the etch stop layer 210. The dielectric layer 212 has a thickness of about 1000 angstrom in some embodiments. In other embodiments, other layers such as a contact layer, additional metal layers, and via layers can be formed between the dielectric layer 205 and the metal layer 206.

In FIG. 2B, a bottom electrode layer 214 is deposited over the dielectric layer 212. An insulating layer 216 is deposited over the bottom electrode layer 214. The insulating layer 216 comprises a dielectric such as silicon dioxide or a high-k dielectric such as hafnium silicate, zirconium silicate, hafnium dioxide or zirconium dioxide, and has a thickness of about 100 angstrom in some embodiments. A top electrode layer 218 is deposited over the insulating layer 216.

The top electrode layer 218 and bottom electrode layer 214 comprise titanium nitride (TiN), copper, copper alloy, aluminum, aluminum alloy, any combination thereof, or any other suitable material and has a thickness of about 400 angstrom in some embodiments. An etch stop layer 220 such as silicon nitride (SiON) is formed over the top electrode layer 218 with a thickness of about 300 angstrom in some embodiments.

In FIG. 2C, the etch stop layer 220 and the top electrode layer 218 are patterned by lithography.

In FIG. 2D, the insulating layer 216, and the bottom electrode layer 214 are patterned by lithography.

In FIG. 2E, additional dielectric layer 224 such as silicon dioxide ($SiO_2$) or PEOX is deposited over the etch stop layer 220, insulating layer 216 and the dielectric layer 212. The dielectric layer 224 has a thickness of about 5000 angstrom in some embodiments. The dielectric layers 212 and 224 are formed in a via layer ($V_X$) in some embodiments. The MIM capacitor 223 is surrounded and insulated by an insulating layer such as the dielectric layers 212 and 224.

An etch stop layer 226 such as SiN is deposited over the dielectric layer 224 with a thickness of about 500 angstrom in some embodiments. A dielectric layer 228 such as silicon dioxide ($SiO_2$) or PEOX is deposited over the etch stop layer 226. The dielectric layer 228 has a thickness of about 9000 angstrom and is formed in a metal layer ($M_{X+1}$) in some embodiments. An etch stop layer 230 such as silicon nitride (SiON) is deposited over the dielectric layer 228 with a thickness of about 600 angstrom in some embodiments.

In FIG. 2F, via patterning is performed by lithography to make trenches 232 through the dielectric layers 228 and 224.

In FIG. 2G, metal layer patterning is performed by lithography to make trenches 234 in FIG. 2F through the dielectric layers 228 and 224.

In FIG. 2H, electrically conductive material, e.g., copper, copper alloy, aluminum, aluminum alloy, any combination thereof, or any other suitable material, is deposited to fill the trenches 234 in FIG. 2G and then excess metal is removed by means of chemical-mechanical polishing (CMP). Via connections 236 to the top electrode layer 218 and the bottom electrode layer 214 are formed for electrical connections of the MIM capacitor 223, and a seal ring portion 237 is formed through the metal layer 240 (Mx), the via layer 242 (Vx), and the metal layer 244 ($M_{X+1}$). Via connections 236 are isolated from the seal ring portion 237 by dielectric layers 228 and 224 formed in the metal layer 244 and the via layer 242. Another seal ring portion (not shown) similar to the seal ring portion 237 will be formed on the left side 203 of the seal ring structure 250.

Even though one via layer 242 and two metal layers 240 and 244 are shown in FIGS. 2A-2H, any number of metal layers and via layers can be used for the seal ring structure 250 having the MIM capacitor 223 within the seal ring structure 250. Any number of metal layers and via layers can be below or above the MIM capacitor 223. The MIM capacitor 223 can be fabricated in any insulating (dielectric) layer similar to 224 or 228 within the seal ring structure 250.

In some embodiments, at least one metal layer such as 206 below the MIM capacitor 223 is removed for further isolation of the MIM capacitor 223. In some embodiments, the seal ring structure 250 includes at least one metal layer such as 240 and 244 and at least one via layer such as 242. The at least one metal layer and the at least one via layer are deposited on top of each other in an alternating order in some embodiments. The MIM capacitor 223 is disposed in an insulating layer such as dielectric layers 224 and 212 formed in one via layer such as 242 in some embodiments.

According to some embodiments, a seal ring structure of an integrated circuit includes a seal ring and a metal-insulator-metal (MIM) capacitor. The MIM capacitor includes a top electrode, a bottom electrode disposed below the top electrode, and a first insulating layer disposed between the top electrode and the bottom electrode. The MIM capacitor is disposed within the seal ring and the MIM capacitor is insulated from the seal ring.

According to some embodiments, a method of fabricating a metal-insulator-metal (MIM) capacitor disposed within a seal ring of an integrated circuit includes forming a bottom electrode over a substrate. The bottom electrode is disposed within the seal ring and insulated from the seal ring. An insulating layer is formed over the bottom electrode. A top electrode is formed over the first insulating layer. The bottom electrode is disposed within the seal ring and insulated from the seal ring.

A skilled person in the art will appreciate that there can be many embodiment variations of this disclosure. Although the embodiments and their features have been described in detail, it should be understood that various changes, substitutions and alterations can be made herein without departing from the spirit and scope of the embodiments. Moreover, the scope of the present application is not intended to be limited to the particular embodiments of the process, machine, manufacture, and composition of matter, means, methods and steps described in the specification. As one of ordinary skill in the art will readily appreciate from the disclosed embodiments, processes, machines, manufacture, compositions of matter, means, methods, or steps, presently existing or later to be developed, that perform substantially the same function or achieve substantially the same result as the corresponding embodiments described herein may be utilized according to the present disclosure.

The above method embodiment shows exemplary steps, but they are not necessarily required to be performed in the order shown. Steps may be added, replaced, changed order, and/or eliminated as appropriate, in accordance with the spirit and scope of embodiment of the disclosure. Embodiments that combine different claims and/or different embodiments are within the scope of the disclosure and will be apparent to those skilled in the art after reviewing this disclosure.

What is claimed is:

1. A seal ring structure of an integrated circuit comprising:
   a seal ring, the seal ring comprising:
      a first conductive feature disposed in a first insulating layer and at an inner boundary of the seal ring; and
      a second conductive feature disposed in the first insulating layer and at an outer boundary of the seal ring; and
   a metal-insulator-metal (MIM) capacitor, the MIM capacitor comprising:
      a top electrode;

a bottom electrode disposed below the top electrode; and a second insulating layer disposed between the top electrode and the bottom electrode, wherein the first insulating layer is over and physically contacting the second insulating layer, wherein at least a portion of the MIM capacitor is disposed directly between the first conductive feature and the second conductive feature of the seal ring and wherein the MIM capacitor is insulated by the first insulating layer from the seal ring.

2. The seal ring structure of claim 1, further comprising a first via connected to the top electrode and a second via connected to the bottom electrode.

3. The seal ring structure of claim 1, wherein the seal ring structure includes at least one metal layer and at least one via layer, the at least one metal layer and the at least one via layer are disposed on top of each other in an alternating order, and the MIM capacitor is disposed within one of the at least one via layer.

4. The seal ring structure of claim 1, wherein the first insulating layer comprises dielectric layers formed in at least one metal layer and at least one via layer.

5. The seal ring structure of claim 1, wherein the seal ring surrounds along four sides of the integrated circuit in a rectangular shape.

6. The seal ring structure of claim 5, wherein the MIM capacitor is disposed along one of the four sides.

7. The seal ring structure of claim 1, wherein the top electrode and the bottom electrode comprise titanium nitride, copper, copper alloy, aluminum, aluminum alloy, or any combination thereof.

8. The seal ring structure of claim 1, wherein the second insulating layer comprises a high-k dielectric material.

9. The seal ring structure of claim 1, wherein the first insulating layer comprises PEOX or silicon dioxide.

10. An integrated circuit (IC) including a seal ring structure, the seal ring structure comprising:

a seal ring with an outmost edge and an innermost edge, wherein the outmost edge is closer to a perimeter of the IC than the innermost edge, the seal ring including a first conductive feature disposed in at least one metal layer and at least one via layer; and a metal-insulator-metal (MIM) capacitor, the MIM capacitor including:

a top electrode;

a bottom electrode disposed below the top electrode;

a first insulating layer disposed between the top electrode and the bottom electrode;

a first via connected to the top electrode; and a second via connected to the bottom electrode, wherein at least a portion of the MIM capacitor is disposed between the outmost edge and the innermost edge of the seal ring, the MIM capacitor is insulated by dielectric layers formed in the at least one metal layer and the at least one via layer, and a topmost surface of the top electrode is disposed below a topmost surface of the first conductive feature.

11. The seal ring structure of claim 10, wherein the seal ring further comprises a second conductive feature disposed in the at least one metal layer and the at least one via layer, at least a portion of the first via and at least a portion of the second via being interposed between the first conductive feature and the second conductive feature.

12. The seal ring structure of claim 11, wherein the first conductive feature is disposed at the outmost edge of the seal ring, and wherein the second conductive feature is disposed at the innermost edge of the seal ring.

13. The seal ring structure of claim 10, wherein the first insulating layer comprises a high-k dielectric material.

14. The seal ring structure of claim 10, wherein the top electrode and the bottom electrode comprise titanium nitride, copper, copper alloy, aluminum, aluminum alloy, or any combination thereof.

15. A seal ring structure of an integrated circuit comprising:

a seal ring, at least a portion of the seal ring being disposed in a first dielectric layer, the seal ring comprising an inner edge and an outer edge; and a metal-insulator-metal (MIM) capacitor being disposed between the inner edge and outer edge of the seal ring, at least a portion of the MIM capacitor being disposed in the first dielectric layer, the MIM capacitor comprising:

a top electrode;

a bottom electrode disposed below the top electrode, wherein a bottom surface of the bottom electrode is substantially level with a bottom surface of the first dielectric layer; and a second dielectric layer disposed between the top electrode and the bottom electrode;

wherein the top electrode and the bottom electrode are separated from the inner edge and outer edge of the seal ring.

16. The seal ring structure of claim 15, further comprising a first via connected to the top electrode and a second via connected to the bottom electrode.

17. The seal ring structure of claim 16, wherein at least a portion of the first via and at least a portion of the second via are disposed in the first dielectric layer.

18. The seal ring structure of claim 16, wherein the second via extends through the second dielectric layer.

19. The seal ring structure of claim 15, wherein the seal ring comprises a first conductive feature and a second conductive feature, the MIM capacitor being disposed between the first conductive feature and the second conductive feature.

20. The seal ring structure of claim 15, wherein a topmost surface of the MIM capacitor is disposed below a topmost surface of the seal ring.

* * * * *